United States Patent

Usimaru

[11] Patent Number: 5,332,980
[45] Date of Patent: Jul. 26, 1994

[54] MODULATION CIRCUIT HAVING FREQUENCY SENSITIVE POWER SUPPLY VOLTAGE

[75] Inventor: Imao Usimaru, Kawasaki, Japan
[73] Assignee: Fujitsu Limited, Japan
[21] Appl. No.: 950,436
[22] Filed: Sep. 23, 1992
[51] Int. Cl.$^5$ .......................... H03C 3/00; H03L 7/08
[52] U.S. Cl. .................... 332/117; 332/123; 332/127; 331/23; 331/175
[58] Field of Search ............. 332/117, 123, 124, 125, 332/126, 127, 128; 331/23, 10, 34, 175; 455/42, 43, 44, 63, 110, 112, 113, 119

[56] References Cited

U.S. PATENT DOCUMENTS 4,117,422  9/1978  Hunt .................... 332/127 X
5,027,087  1/1991  Rottinghaus ............ 331/10 X Primary Examiner—David Mis
Attorney, Agent, or Firm—Greer, Burns & Crain, Ltd.

[57] ABSTRACT

A modulation circuit utilized in a mobile radio communication transmitter includes an amplifier for amplifying a modulation signal and a modulator having a voltage-controlled oscillator for generating a frequency modulation signal corresponding to the modulation signal. An amplifier controller applies a first predetermined constant direct current voltage $V_1$ to a power source of the amplifier when the frequency of the modulation signal is less than a predetermined frequency $f_3$, and for a second predetermined constant direct current voltage $V_2$ to a power source of the amplifier when the frequency of the modulation signal is higher than the frequency $f_3$. Thus, when the frequency of the modulation signal is less than the frequency $f_3$, the amplitude of the modulation signal which is added to the voltage-controlled oscillator decreases by a predetermined value compared with the case where the frequency of the modulation signal is higher than the frequency $f_3$. By using this modulator circuit, a lock-up time of a phase-locked loop can be accelerated and a maximum frequency deviation of the frequency modulation signal can be flat within the transmission band.

9 Claims, 6 Drawing Sheets

MODULATION CIRCUIT HAVING FREQUENCY SENSITIVE POWER SUPPLY VOLTAGE

BACKGROUND OF THE INVENTION

1. Filed of the Invention

The present invention relates to a modulation circuit utilized in a mobile radio communication transmitter.

2. Description of the Related Art

For voice transmission in a mobile communication system, usually an analog transmission using a frequency modulation is utilized, because of the effective use of a frequency band, high quality transmission, small apparatus and the like.

Although a modulation circuit using phaselocked loop is widely used as mentioned hereinafter, it is necessary that a lock-up time of the phase-locked loop be quick and a maximum frequency deviation of the frequency modulation wave be approximately flat within a transmission band.

Explanations regarding related art will be given later with reference to the attached figures.

SUMMARY OF THE INVENTION

An object of the present invention is to accelerate a lock-up time of a phase-locked loop in a modulation circuit, and moreover to provide an approximately flat maximum frequency deviation in the transmission band.

In the present invention, there is provided a modulation circuit including an amplifier for amplifying a modulation signal having a frequency band from frequency $f_1$ to frequency $f_2$, and a modulator having a voltage-controlled oscillator, for generating a frequency modulation signal corresponding to the modulation signal.

The modulation circuit comprises an amplifier control means for supplying a predetermined direct current voltage $V_1$ as a power source voltage of the amplifier when a frequency of the modulation signal is detected as being lower than a predetermined frequency $f_3$ which is mid way between frequencies $f_1$ and $f_2$; and for supplying a predetermined direct current voltage $V_2$ ($V_1 < V_2$) as a power source voltage of the amplifier when a frequency of the modulation signal is detected as being higher than the predetermined frequency $f_3$. As a result, when the frequency of the modulation signal is lower than the predetermined frequency $f_3$, an amplitude of the modulation signal which is supplied to the voltage-controlled oscillator is lower by a predetermined amount than when the frequency of the modulation signal is higher than the frequency $f_3$.

The modulation circuit may further comprise an amplitude detection switch control means for supplying a predetermined direct current voltage $V_3$ ($V_2 < V_3$) as a power source voltage of the amplifier with no regard to a frequency of the modulation signal when the amplitude of the modulation signal having frequencies $f_1$ to $f_2$ is detected to be lower than a predetermined amount.

Other features and advantages of the invention will be apparent from the following description with reference to the accompanying drawings.

DESCRIPTION OF THE PREFERRED EMBODIMENTS

Prior to explaining the embodiments, prior art relating to this invention are explained with reference to FIGS. 1 to 3.

Figure 1:
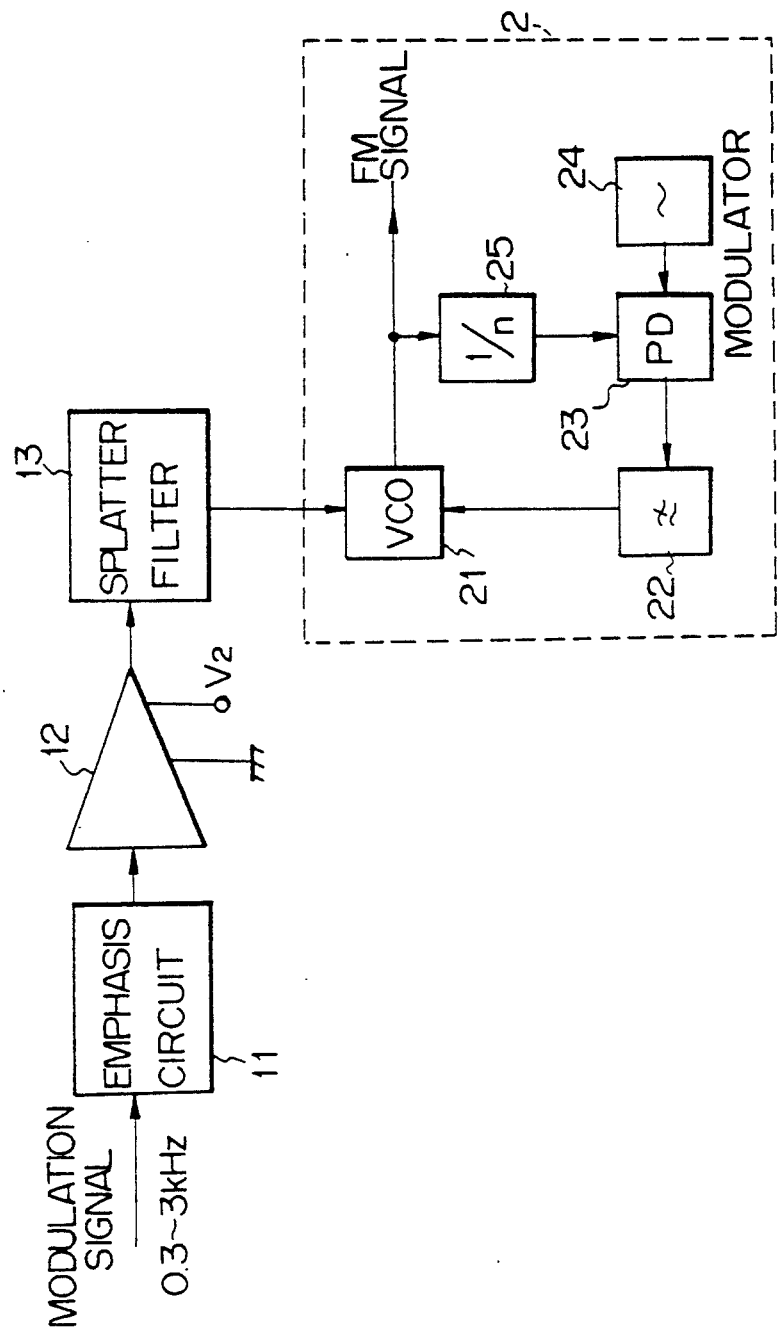
FIG. 1 is a block diagram showing a conventional modulation circuit.
Figure 2:
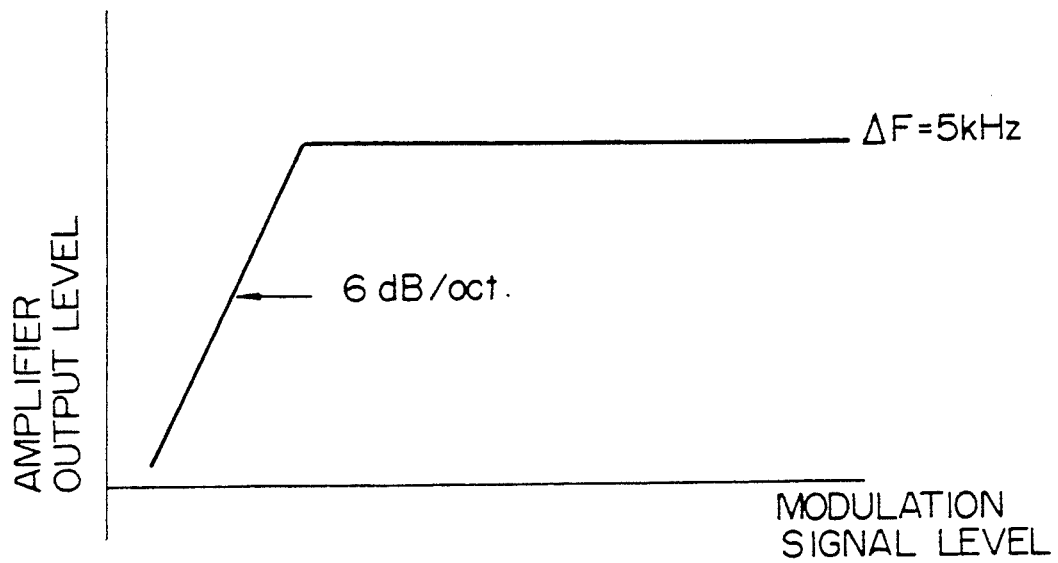
FIG. 2 is a graph showing characteristics of an emphasis circuit.
Figure 3:
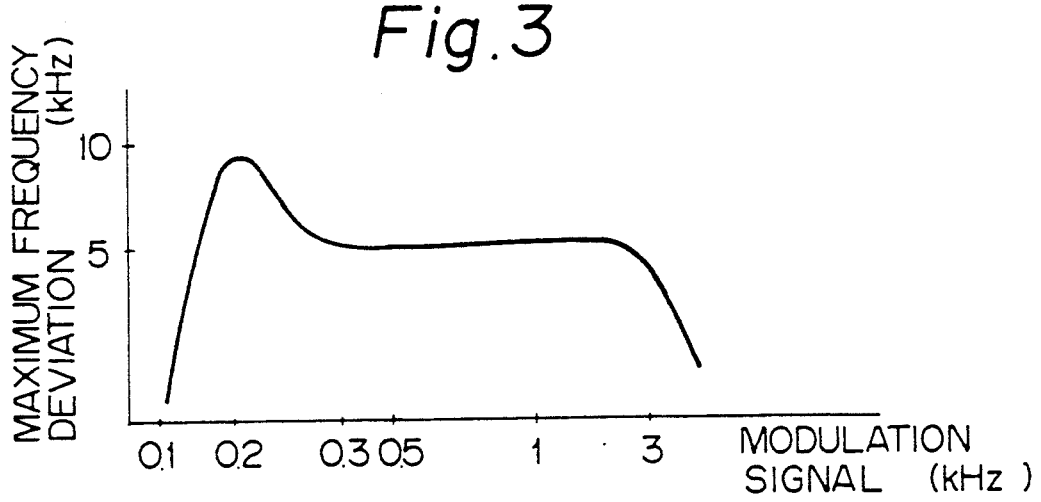
FIG. 3 is an explanatory diagram showing a relationship between frequency of a modulation signal and a maximum frequency deviation.

FIG. 1 is a block diagram showing a conventional example of a modulation circuit, and FIGS. 2 and 3 are explanatory diagrams of the operation of the circuit of FIG. 1. FIG. 2 is an explanatory diagram showing characteristics of an amplifier between input and output signals, and FIG. 3 is an explanatory diagram showing a relationship between a modulation frequency and a maximum frequency deviation of the frequency modulation signal.

Hereinafter, the operation of the circuit of FIG. 1 is explained with reference to FIGS. 2 and 3. First, a modulation signal (for example, a voice signal having a frequency band of 0.3 to 3 kHz) is supplied to an emphasis circuit 11. The emphasis circuit 11 emphasizes the modulation signal by an emphasis of 6 dB/octave as shown on the left side of FIG. 2 and the emphasized signal is sent to an operation amplifier 12 which operates as a limiter.

The operational amplifier 12 has supplied thereto a power supply voltage $V_2$. When the amplitude (level) of the modulation signal is higher than a predetermined value, the output level is limited by a later mentioned setting value as shown in FIG. 2.

As long as the output level of the modulation signal, the frequency of which is lower than a predetermined value in an input level, does not reach the limit level, the operational amplifier operates only as an amplifier.

After the high frequency components are eliminated in the output of the operational amplifier 12 by a splatter filter 13, the output is applied to the voltage-controlled oscillator (hereinafter abbreviated as VCO) 21.

The VCO generates and supplies a frequency modulation signal having a frequency deviation corresponding to an output level of the splatter filter, the frequency modulation signal is frequency divided by n using n divider 25, and the divided output is supplied to a phase detector (PD) 23.

Here, the maximum frequency deviation is determined as, for example, ±5 kHz corresponding to the modulation frequency band 0.3 to 3 kHz.

Since the phase detector is also supplied with the output of a reference oscillator 24, the phase difference between the divided output and the output of the phase detector is detected, and the phase difference signal corresponding to the phase difference is supplied to VCO 21 through a loop filter 22, which is a low pass filter, as a control signal.

The VCO 21, the frequency divider 25, the phase-detector 23, and the low pass filter 22 constitute a phase-locked loop (hereinafter abbreviated as PLL), and since the loop is a negative feedback loop, the oscillating frequency is controlled so that the phase difference of the VCO is, for example, zero.

At that time, if the cut-off frequency of the loop filter is lowered, the lock-up time of the PLL becomes long and the maximum frequency deviation in the voice band 0.3 to 3 kHz becomes constant (flat). On the other hand, if the cut-off frequency is high, the lock-up time is short and the maximum frequency deviation shown in FIG. 3 is not flat.

It is considered that since the above loop filter does not attenuate the low modulation frequency much, the signal from the splatter filter and the signal from the loop filter are added and the maximum frequency deviation is different.

Accordingly, hitherto, the maximum frequency deviation and the lock-up time must be determined so as not to cause problems in practical application.

As mentioned above, there arises a problem that a proper value must be determined for both the maximum frequency deviation and the lock-up time.

Figure 4:
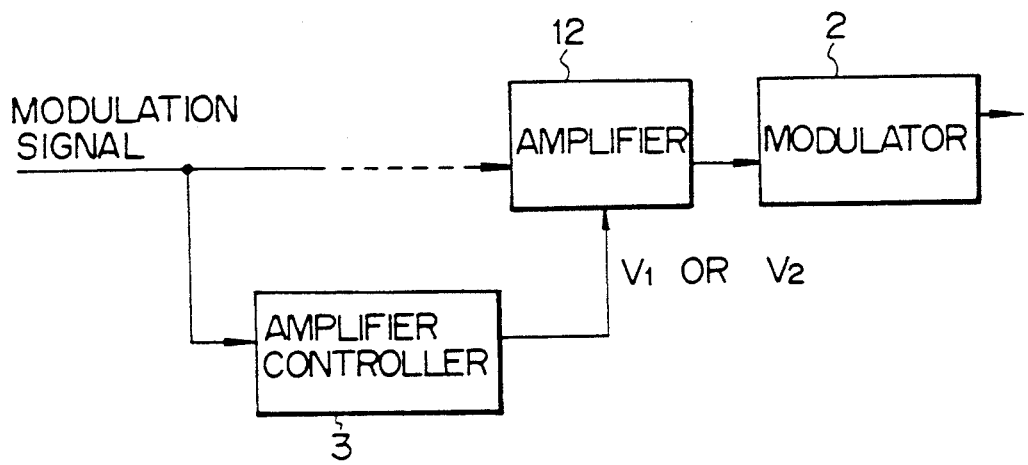
FIG. 4 is a schematic block diagram showing a summary of the modulation circuit according to a first embodiment of the invention.

FIG. 4 is a schematic block diagram according to a first embodiment of the invention.

In the figure, reference numeral 12 is an amplifier for supplying a modulation signal having a frequency band from $f_1$ to $f_2$, 2 is a modulator having a voltage-controlled oscillator for generating a frequency modulation signal (wave) corresponding to the input modulation signal.

A amplifier controller 3 is as an amplifier control means for applying a predetermined direct current voltage $V_1$ as a power source to the amplifier 12 when the frequency of the modulation signal is detected to be lower than the predetermined frequency $f_3$, and for applying a predetermined direct current voltage $V_2$ as a power source to the amplifier 12 when the frequency of the modulation signal is detected to be higher than the predetermined frequency $f_3$.

In the first embodiment, when the frequency of the modulation signal is lower than the predetermined frequency, the amplitude of the modulation signal applied to the voltage-controlled oscillator is decreased by a predetermined amount, as opposed to a case where the frequency of the modulation signal is higher than a predetermined frequency.

In the first embodiments, the amplifier controller 3 controls the power source voltage of the amplifier 12 in accordance with the frequency of the modulation signal.

Accordingly, the limiting level of the amplifier 12 when the frequency of the modulation signal is less than the frequency $f_3$, is lower than that when the frequency of the modulation signal is higher than the frequency $f_3$.

As a result, the level of the modulation signal applied to the VCO changes close to the frequency $f_3$. The maximum frequency deviation of the frequency modulation signal supplied from the modulation circuit does not exceed the defined value and is not affected by the cut off frequency of the loop filter.

Figure 5:
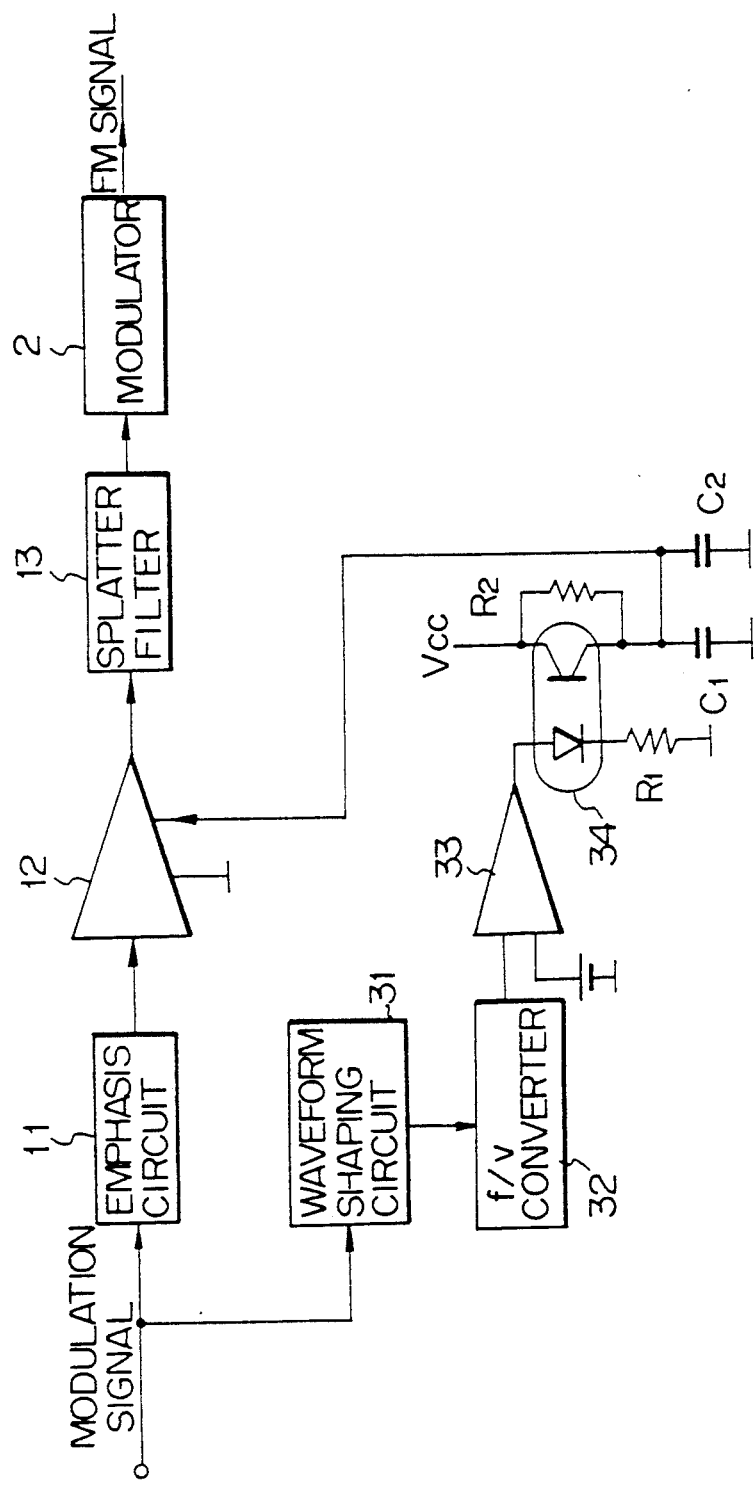
FIG. 5 is a detailed block diagram showing the embodiment of FIG. 4.
Figure 6:
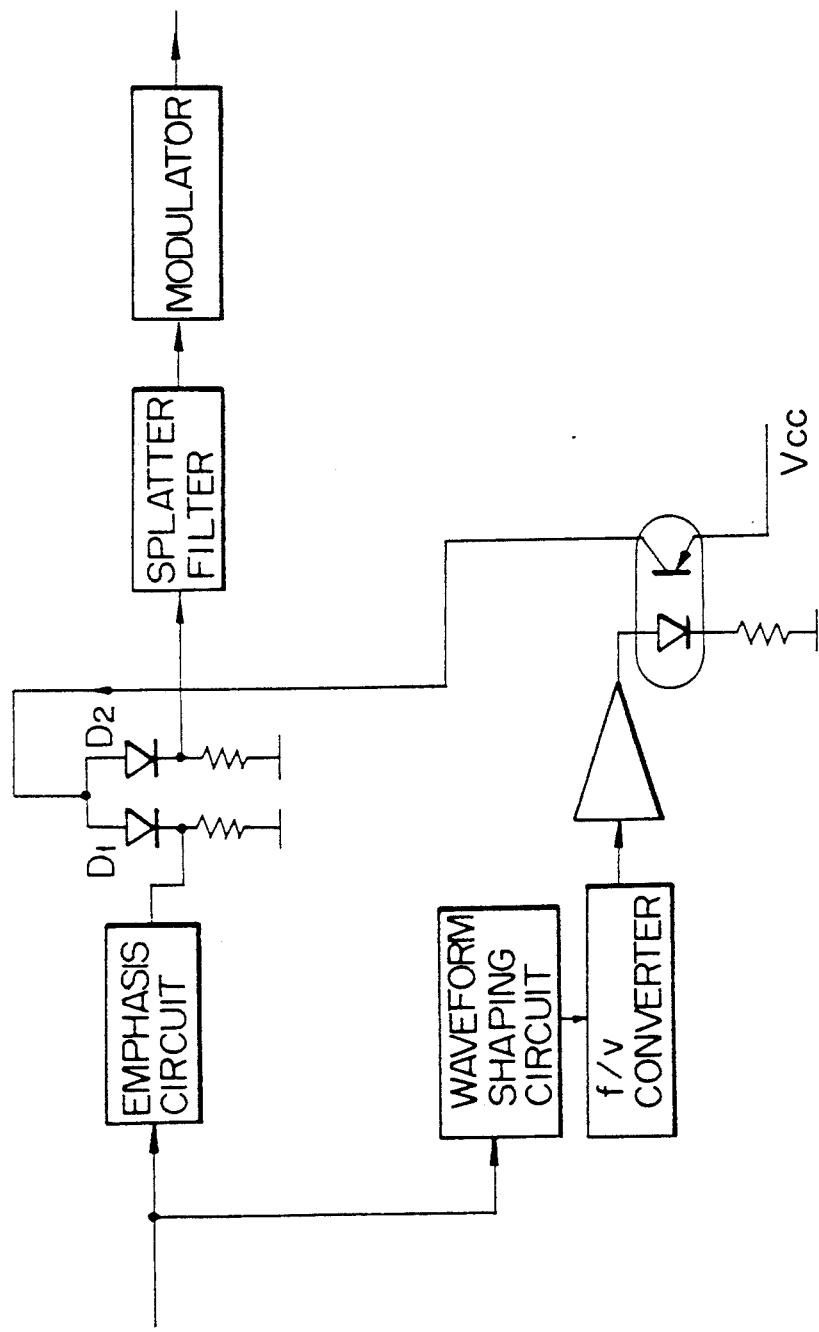
FIG. 6 is a block diagram showing a modification of the embodiment of FIG. 4.

FIG. 5 shows a detailed block diagram of the first embodiment and FIG. 6 shows a modification of the same.

In FIG. 5, a waveform shaping circuit 31, a frequency/voltage (f/v) converter 32, an operational amplifier 33, a photocoupler 34, resistors $R_1$ and $R_2$, and capacitors $C_1$ and $C_2$ are elements of the amplifier controller 3.

Next, operation of the circuits in FIGS. 5 and 6 are explained. However, since operation of the emphasis circuit 11, the amplifier 12, the splatter filter 13, and the modulator 2 have already been explained, these are only summarized, while portions relating to this invention are explained in detail.

First, in FIG. 5, the modulation signal is converted to a square wave through the waveform shaping circuit 31 and supplied to the f/v converter 32.

The f/v converter supplies a direct current voltage corresponding to the frequency of the square wave to the operational amplifier 33. The above direct current voltage is, for example, a low value when the frequency is low, and a high value when the frequency is high, namely, is approximately proportional to the frequency.

The operational amplifier 33 passes a set current to a light emitting diode in a photocoupler that emits light, when the input direct current voltage is higher than the direct current voltage corresponding to the predetermined frequency $f_3$.

As a result, the photodiode in the photocoupler receives light and passes electric current, and the direct current voltage $V_2$ is applied to the amplifier 12.

Thus, the modulation signal having a frequency component higher than the frequency $f_3$ passing through the emphasis circuit 11 is limited in amplitude by the predetermined level by the amplifier which operates as limiter, and is supplied to the modulator through the splatter filter 13.

On the other hand, the operational amplifier 33 passes another set electric current to the light emitting diode in the photocoupler and emits light, when the input direct current voltage is lower than the direct current voltage corresponding to the predetermined frequency $f_3$.

Then, the photodiode in the photocoupler receives light, passes the corresponding electric current, and the direct current voltage $V_1$ is applied to the amplifier 12. The limited level is lower than that of direct current voltage $V_2$.

The modulation signal having a lower frequency component than the frequency $f_3$ through the emphasis circuit 11 is limited to another predetermined lower level in amplitude by the amplifier which operates as a limiter, and is supplied to the modulator through the splatter filter 13.

Further in FIG. 6, the amplifier which operates as limiter in FIG. 5 is constituted by diodes $D_1$ and $D_2$. The operation thereof is similar to that of FIG. 5.

As a result, the lock-up time of the PLL is accelerated and the maximum frequency deviation is approximately flat in the transmission band.

Figure 7:
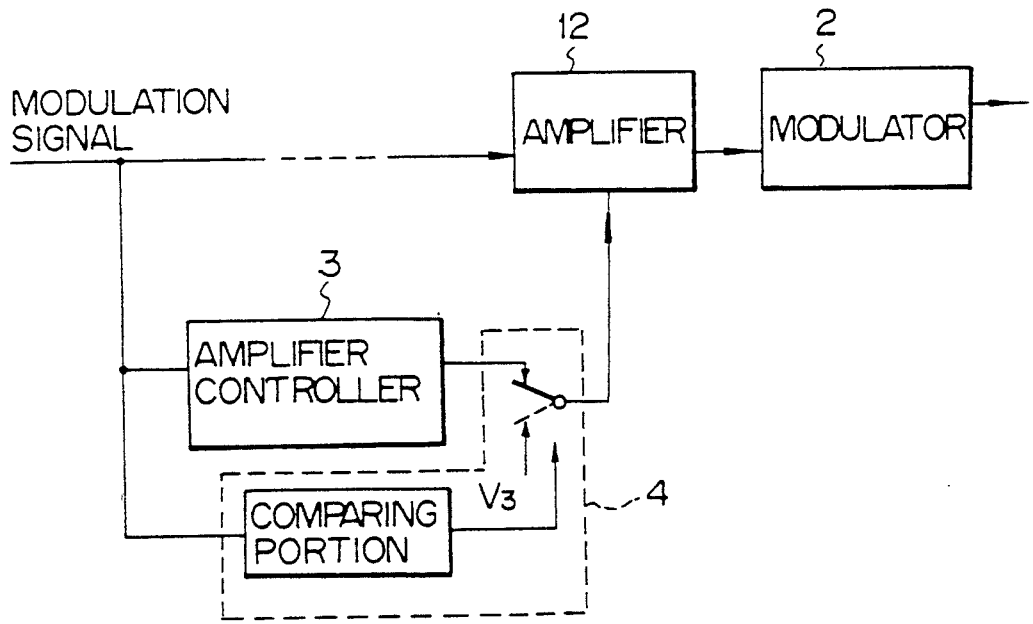
FIG. 7 is a schematic block diagram showing a summary of the modulation circuit according to a second embodiment of the invention.

A second embodiment of the invention is shown in summary in FIG. 7. In the figure, reference numeral 4 is an amplitude detection switch controller, and the other elements are approximately the same as those of the first embodiment.

In the second embodiment, when the amplitude detection switch controller 4 detects that the amplitude of the modulation signal having a frequency band ($f_1$ to $f_2$) that is less than a predetermined value, the predetermined direct current voltage $V_3$ is applied to the amplifier, and when the amplitude of the modulation signal is higher than the predetermined value, the predetermined direct current voltage $V_1$ or $V_2$ is applied to the amplifier through the amplifier controller. The other operations are approximately the same as those of the first embodiment.

In the second embodiment, the amplitude detection switch controller detects the level of the modulation signal. If the detected level is less than the predetermined value, since the maximum frequency deviation does not exceed the defined value when the modulation signal is amplified and supplied to the VCO, the direct current voltage $V_3$ is applied to the amplifier to amplify the modulation signal.

If the detected level is higher than the predetermined value, the switch is driven, the direct current voltage from the amplifier controller is applied to the amplifier, and the limit level is changed.

Thus, the lock-up time of the PLL is accelerated and moreover, the maximum frequency deviation can be approximately flat in the transmission band.

Figure 8:
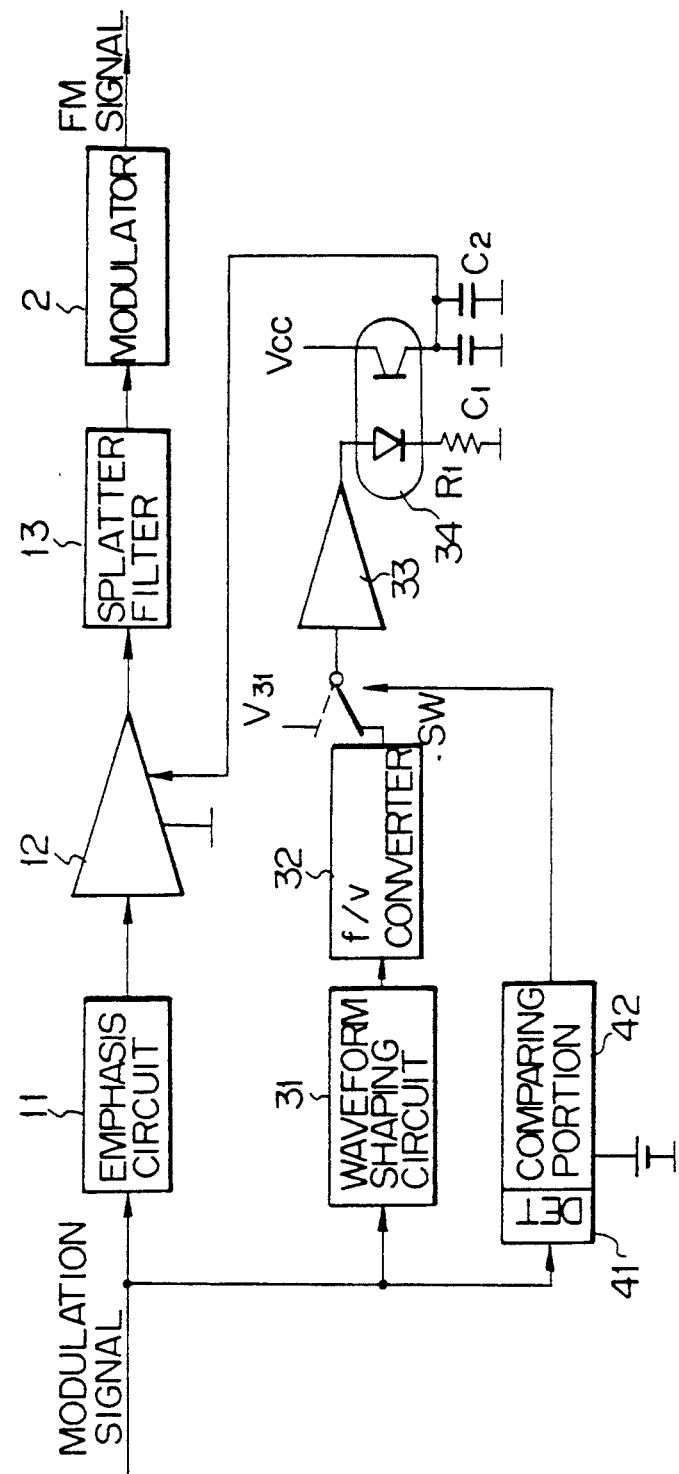
FIG. 8 is a detailed block diagram showing the embodiment of FIG. 7.

Next, a detailed block diagram of the second embodiment is shown in FIG. 8. In FIG. 8 also, the emphasis circuit 11, the splatter filter 13; the waveform shaping circuit 31, the f/v converter 32, the operational amplifier 33, the photocoupler 34, the capacitors $C_1$ and $C_2$, and the resistor $R_1$ which are included in the amplifier controller 3 are the same as those of the first embodiment. The amplitude detection switch controller 4 comprises a detector 41, a comparing portion 42 and switch SW. Hereinafter, the portions different from the first embodiment are explained.

In FIG. 8, the detector 41 detects the modulation signal, obtains a direct current component, and the direct current component is supplied to the comparing portion 42. The comparing portion 42 detects when the direct current component is lower than a threshold value, and the switch is then transferred to the broken line side and the operational amplifier has applied thereto the direct current voltage $V_{31}$.

Since the photocoupler 34 applies to the amplifier the direct current voltage $V_3$ which corresponds to the output of the operational amplifier, the modulation signal through the emphasis circuit 11 is amplified by the amplifier 12 and is supplied to the modulator 2 through the splatter filter 13.

In the above case, since the level of the modulation signal is low, the characteristic of maximum frequency deviation may be satisfied notwithstanding the amplification by the amplifier.

On the other hand when the direct current component is detected to be higher than the threshold value, the comparing portion 42 transfers the switch to the solid line side and the operation in FIG. 5 is executed.

As mentioned above, by using these embodiments, the lock-up time of the PLL is accelerated and moreover the maximum frequency deviation becomes approximately flat in the transmission band.

I claim:

1. A modulation circuit including an amplifier for amplifying a modulation signal having a frequency band from a first frequency $f_1$ to a second frequency $f_2$, and a modulator having a voltage-controlled oscillator, for generating a frequency modulation signal corresponding to the modulation signal; comprising
an amplifier control means for supplying a first constant predetermined direct current voltage $V_1$ as a power source voltage of the amplifier when a frequency of the modulation signal is detected to be lower than a predetermined third frequency $f_3$ which is mid way between the first frequency $f_1$ and the second frequency $f_2$; and for supplying a second constant predetermined direct current voltage $V_2$, being higher than the first constant predetermined direct current voltage $V_1$, as a power source voltage of the amplifier when a frequency of the modulation signal is detected to be higher than the predetermined third frequency $f_3$;
whereby, when the frequency of the modulation signal is lower than the predetermined third frequency $f_3$, an amplitude of the modulation signal which is supplied to the voltage-controlled oscillator is lower by a predetermined amount than that of when the frequency of the modulation signal is higher than the third frequency $f_3$.

2. A modulation circuit as set forth in claim 1, wherein
said amplifier control means comprises a frequency/voltage converter, a comparator for comparing an output of the frequency/voltage converter with a reference voltage, and a power supply circuit being voltage controlled by the output of the comparator.

3. A modulation circuit as set forth in claim 1, further comprising an amplitude detection switch control means for applying a predetermined direct current third voltage $V_3$ being higher than the second voltage $V_2$ as a power source of the amplifier notwithstanding the frequency of the modulation signal when it is detected that the amplitude of the modulation signal is less than a set value.

4. A modulation circuit as set forth in claim 3, wherein
said amplifier control means comprises a frequency/voltage converter and said amplitude detection switch control means comprises a switch and an amplitude detection and comparing portion; when it is determined that the amplitude of the modulation signal is less than a set value by comparing with a reference voltage using the amplitude detection and comparing portion, the switch is transferred, and the predetermined direct current voltage $V_3$ is applied to the amplifier as a power source; when the amplitude of the modulation signal is higher than the set value, the switch is transferred and the output of the frequency/voltage converter is applied to the power source of the amplifier so that the first voltage $V_1$ or second voltage $V_2$ is applied to the amplifier corresponding to the frequency of the modulation signal.

5. A modulation circuit as set forth in claim 1, wherein
said amplifier comprises a parallel circuit being a pair of series circuits of diodes and resistors, the modulation signal is supplied to one of the connecting points between the diode and the resistor, the output signal is obtained from another connecting point between the other diode and the other resistor, and the direct current first voltage $V_1$ or the second voltage $V_2$ is applied to a connecting point between the two diodes as a control voltage.

6. A modulation circuit including an amplifier for amplifying a modulation signal having a frequency band from a first frequency $f_1$ to a second frequency $f_2$, and a modulator having a voltage-controlled oscillator, for generating a frequency modulation signal corresponding to the modulation signal; comprising
an amplifier control means for supplying a first predetermined direct current voltage $V_1$ as a power source voltage of the amplifier when a frequency of the modulation signal is detected to be lower than a predetermined third frequency $f_3$ which is mid way between the first frequency $f_1$ and the second frequency $f_2$; and for supplying a second predetermined direct current voltage $V_2$, being higher than the first constant predetermined direct current voltage $V_1$, as a power source voltage of the amplifier when a frequency of the modulation signal is detected to be higher than the predetermined third frequency $f_3$;

said amplifier control means including a frequency/voltage converter, a comparator for comparing an output of the frequency/voltage converter with a reference voltage, and a power supply circuit being voltage controlled by the output of the comparator;

whereby, when the frequency of the modulation signal is lower than the predetermined third frequency $f_3$, an amplitude of the modulation signal which is supplied to the voltage-controlled oscillator is lower by a predetermined amount than that of when the frequency of the modulation signal is higher than the third frequency $f_3$.

7. A modulation circuit including an amplifier for amplifying a modulation signal having a frequency band from a first frequency $f_1$ to a second frequency $f_2$, and a modulator having a voltage-controlled oscillator, for generating a frequency modulation signal corresponding to the modulation signal; comprising an amplifier control means for supplying a first predetermined direct current voltage $V_1$ as a power source voltage of the amplifier when a frequency of the modulation signal is detected to be lower than a predetermined third frequency $f_3$ which is mid way between the first frequency $f_1$ and the second frequency $f_2$; and for supplying a second predetermined direct current voltage $V_2$, being higher than the first constant predetermined direct current voltage $V_1$, as a power source voltage of the amplifier when a frequency of the modulation signal is detected to be higher than the predetermined third frequency $f_3$;

whereby, when the frequency of the modulation signal is lower than the predetermined third frequency $f_3$, an amplitude of the modulation signal which is supplied to the voltage-controlled oscillator is lower by a predetermined amount than that of when the frequency of the modulation signal is higher than the third frequency $f_3$; and an amplitude detection switch control means for applying a predetermined direct third voltage $V_3$ being higher than the second voltage $V_2$ as a power source of the amplifier notwithstanding the frequency of the modulation signal when it is detected that the amplitude of the modulation signal is less than a set value.

8. A modulation circuit as set forth in claim 7, wherein said amplifier controller means comprises a frequency/voltage converter and said amplitude detection switch control means comprises a switch and an amplitude detecting and comparing portion; when it is determined that the amplitude of the modulation signal is less than a set value by comparing with a reference voltage using the amplitude detection and comparing portion, the switch is transferred, and the predetermined direct current voltage $V_3$ is applied to the amplifier as a power source; when the amplitude of the modulation signal is higher than the set value, the switch is transferred and the output of the frequency/voltage converter is applied to the power source of the amplifier so that the voltage $V_1$ or $V_2$ is applied to the amplifier corresponding to the frequency of the modulation signal.

9. A modulation circuit including an amplifier for amplifying a modulation signal having a frequency band from a first frequency $f_1$ to a second frequency $f_2$, and a modulator having a voltage-controlled oscillator, for generating a frequency modulation signal corresponding to the modulation signal; comprising an amplifier control means for supplying a first predetermined direct current voltage $V_1$ as a power source voltage of the amplifier when a frequency of the modulation signal is detected to be lower than a predetermined third frequency $f_3$ which is mid way between the first frequency $f_1$ and the second frequency $f_2$; and for supplying a second predetermined direct current voltage $V_2$, being higher than the first constant predetermined direct current voltage $V_1$, as a power source voltage of the amplifier when a frequency of the modulation signal is detected to be higher than the predetermined third frequency $f_3$;

whereby, when the frequency of the modulation signal is lower than the predetermined third frequency $f_3$, an amplitude of the modulation signal which is supplied to the voltage-controlled oscillator is lower by a predetermined amount than that of when the frequency of the modulation signal is higher than the third frequency $f_3$; and said amplifier having a parallel circuit being a pair of series circuits of diodes and resistors, the modulation signal is supplied to one of the connecting points between the diode and the resistor, the output signal is obtained from another connecting point between the other diode and the other resistor, and the direct current first voltage $V_1$ or the second voltage $V_2$ is applied to a connecting point between the two diodes as a control voltage.

* * * * *